United States Patent
Shestakova et al.

(10) Patent No.: US 10,228,485 B2
(45) Date of Patent: Mar. 12, 2019

(54) BORON NITRIDE NANOTUBES (BNNT) IN POLYMERS FOR EXTREME ENVIRONMENT

(71) Applicant: Schlumberger Technology Corporation, Sugar Land, TX (US)

(72) Inventors: Irina Shestakova, Sugar Land, TX (US); Olivier Philip, Ewing, NJ (US); Irina Molodetsky, West Windsor, NJ (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 15/392,604

(22) Filed: Dec. 28, 2016

(65) Prior Publication Data

US 2018/0180760 A1 Jun. 28, 2018

(51) Int. Cl.
| | |
|---|---|
| *G01V 5/08* | (2006.01) |
| *G01V 5/00* | (2006.01) |
| *H05K 1/03* | (2006.01) |
| *H01L 27/146* | (2006.01) |
| *H01L 27/148* | (2006.01) |
| *H01L 31/115* | (2006.01) |
| *H01L 31/0203* | (2014.01) |
| *H05K 3/28* | (2006.01) |
| *G01T 1/20* | (2006.01) |

(52) U.S. Cl.
CPC ............. *G01V 5/00* (2013.01); *G01T 1/20* (2013.01); *H01L 27/148* (2013.01); *H01L 27/14618* (2013.01); *H01L 27/14663* (2013.01); *H01L 31/0203* (2013.01); *H01L 31/115* (2013.01); *H05K 1/0373* (2013.01); *H05K 1/0393* (2013.01); *H05K 3/285* (2013.01); *H05K 2201/0175* (2013.01); *H05K 2201/10151* (2013.01)

(58) Field of Classification Search
CPC ..................................... G01V 5/00; G01T 1/20
See application file for complete search history.

(56) References Cited

U.S. PATENT DOCUMENTS

| | | | | |
|---|---|---|---|---|
| 2005/0116336 | A1* | 6/2005 | Chopra ................. | B82Y 10/00 257/720 |
| 2010/0229749 | A1* | 9/2010 | Veneruso ............... | B82Y 10/00 102/322 |
| 2014/0127053 | A1* | 5/2014 | Sheth .................... | H01B 7/282 417/410.1 |
| 2015/0170791 | A1 | 6/2015 | Varkey et al. | |
| 2016/0274038 | A1* | 9/2016 | Brady ..................... | E21B 49/00 |

OTHER PUBLICATIONS

Chen, X. et al., "Mechanical strength of boron nitride nanotube-polymer interfaces", Applied Physics Letters, 2015, 107, 5 pages.

* cited by examiner

*Primary Examiner* — David Porta
*Assistant Examiner* — Mamadou Faye
(74) *Attorney, Agent, or Firm* — Michael Dae (57) ABSTRACT

A downhole tool includes a housing a measurement device disposed in the housing. The measurement device includes a sensor and electronic circuitry configured to detect or process signals detected by the sensor. The housing, the sensor, or the electronic circuitry, or any combination thereof, includes a polymer matrix with integrated boron nitride nanotubes.

19 Claims, 6 Drawing Sheets

BORON NITRIDE NANOTUBES (BNNT) IN POLYMERS FOR EXTREME ENVIRONMENT

BACKGROUND

This disclosure relates to improving the performance of electronic devices for applications in harsh environments.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions.

Electronic devices are used in a broad range of applications. In certain use cases, these electronic devices may be subjected to harsh conditions, which may include high temperature, high mechanical stress, high vibration, exposure to radiation, and so forth. As may be appreciated, these harsh conditions may impose challenges to reliable operation. Indeed, significant heat may be generated during operation of an electronic device, and if the heat is not sufficiently removed, the electronic device may be subjected to high temperature, which may lead to degraded performance and/or limited lifetime. Other high-temperature environments include those found in well logging, combustion engines, jet engines, turbines, power plants, and others. For example, when a well is drilled into a geological formation, logging tools equipped with electronic devices (e.g., electronic components and/or sensors) may be used to determine a variety of characteristics of the well, generally known as well logging. The downhole temperature may exceed 200 degrees Celsius (° C.), and the space inside the well is limited. These constraints, among other factors, may hinder the use of electronic devices in such extreme environments.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Systems of this disclosure enhance performance and reliability of electronic devices in harsh environments. In a first example, a downhole tool includes a housing a measurement device disposed in the housing. The measurement device includes a sensor and electronic circuitry configured to detect or process signals detected by the sensor. The housing, the sensor, or the electronic circuitry, or any combination thereof, includes a polymer matrix with integrated boron nitride nanotubes.

In a second example, an electronic device includes a circuit board. The circuit board includes an insulating material that includes integrated boron nitride nanotubes. The circuit board also includes a first conductive layer disposed on or within the insulating material.

In a third example, a method of manufacturing an electronic device includes coupling an insulating layer to a conducting layer to form a circuit board of the electronic device; or enclosing, within a housing, the circuit board and electronic components coupled thereto. The insulating layer or the housing includes a matrix with integrated boron nitride nanotubes to enhance at least heat dissipation or mechanical strength of the electronic device.

Various refinements of the features noted above may be undertaken in relation to various aspects of the present disclosure. Further features may also be incorporated in these various aspects as well. These refinements and additional features may be made individually or in any combination. For instance, various features discussed below in relation to one or more of the illustrated embodiments may be incorporated into any of the above-described aspects of the present disclosure alone or in any combination. The brief summary presented above is intended to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of the present disclosure will be described below. These described embodiments are examples of the presently disclosed techniques. Additionally, in an effort to provide a concise description of these embodiments, features of an actual implementation may not be described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

While electronic devices may be subjected to harsh operation conditions (e.g., high temperature, high mechanical stress, high vibration, radiation), it may be desirable to reinforce and/or integrate at least a portion of the electronic devices with materials having certain properties to enhance the thermal conductivity, electrical insulation, and mechanical strength, among other properties, of the electronic devices. Boron nitride nanotubes (BNNTs) having a valuable combination of properties may be used to enhance the performance and reliability of electronic devices operating under hostile conditions. It should be understood that the BNNTs discussed here are not limited to a particular type of nanotube. For example, the BNNTs may include single-walled BNNTs, double-walled BNNTs, and/or BNNTs having more than double-walls. For example, the BNNTs may include a variety of site selections and/or chiralities. For example, the BNNTs may be nanotubes of varying lengths and/or diameters.

Figure 1:
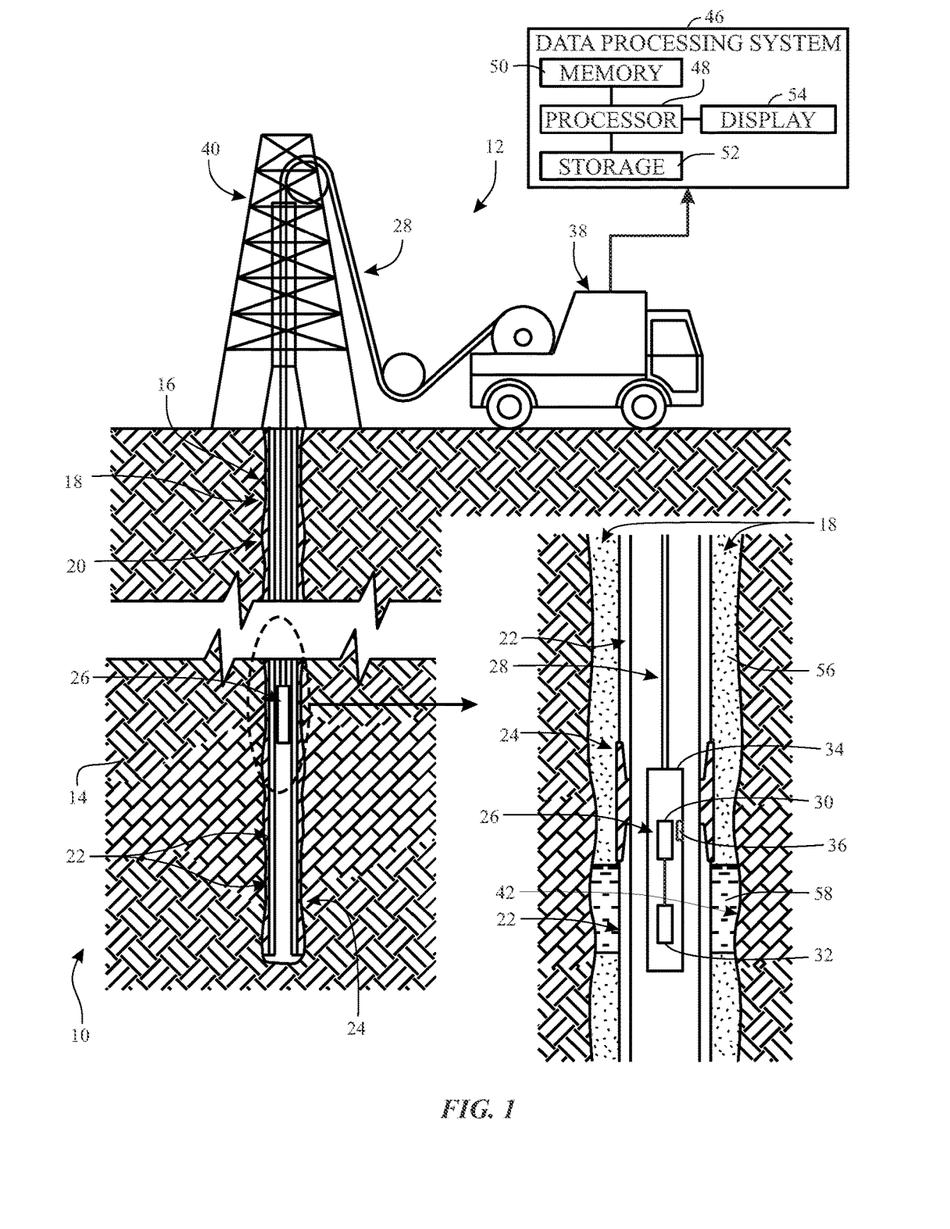
FIG. 1 is a schematic of a system for obtaining well logging data using electronic devices having improved performance based in part on enhanced heat dissipation, in accordance with an embodiment.

As set forth above, there may be events that an electronic device is subjected to harsh environment, depending on the usage and/or applications (e.g., well logging, combustion engines, jet engines, turbines, power plants, among others). By way of non-limiting example, FIG. 1 illustrates a system 10 for obtaining well logging data in a cased well using a logging tool including electronic device(s) with improved performance based in part on enhanced heat dissipation. It should be appreciated, however, that similar well logging may be performed before the well is cased. The illustrated example is merely intended to provide one example of a downhole logging system 10 that may employ electronics enhanced by boron nitride nanotubes (BNNTs).

In the illustrated embodiment of FIG. 1, surface equipment 12 is above a geological formation 14, and a drilling operation has previously been carried out to drill a wellbore 16. In addition, an annular fill 18 (e.g., cement) has been used to seal an annulus 20, the space between the wellbore 16 and casing joints 22 and collars 24, with cementing operations. Several casing joints 22 (also referred to below as casing 22) are coupled together by the casing collars 24 to stabilize the wellbore 16. The casing joints 22 represent lengths of pipe, which may be formed from steel or similar materials. In one example, the casing joints 22 each may be approximately 13 m or 40 ft long, and may include an externally threaded (male thread form) connection at each end. A corresponding internally threaded (female thread form) connection in the casing collars 24 may connect two nearby casing joints 22. Coupled in this way, the casing joints 22 may be assembled to form a casing string to a suitable length and specification for the wellbore 16. The casing joints 22 and/or collars 24 may be made of carbon steel, stainless steel, or other suitable materials to withstand a variety of forces, such as collapse, burst, and tensile failure, as well as chemically aggressive fluid. The surface equipment 12 may carry out various well logging operations to detect conditions of the wellbore 16. The well logging operations may measure parameters of the geological formation 14 (e.g., resistivity or porosity) and/or the wellbore 16 (e.g., temperature, pressure, fluid type, or fluid flowrate). The well logging operations may use scintillators for new energy resource exploration, X-ray security, nuclear cameras, computed tomography, and gas exploration. Other measurements may provide acoustic evaluation data (e.g., flexural attenuation and/or acoustic impedance) that may be used to verify the cement installation and the zonal isolation of the wellbore 16.

The example of FIG. 1 shows the logging tool 26 being conveyed through the wellbore 16 by a cable 28. Such a cable 28 may be a mechanical cable, mechanical cable attached to an electrical cable, or an electro-optical cable that includes a fiber line protected against the harsh environment of the wellbore 16. In other examples, however, the logging tool 26 may be conveyed using any other suitable conveyance, such as coiled tubing. The logging tool 26 may be, for example, a scintillation detector, an ultrasonic imager, an X-ray cameral, an isolation scanner, or any other electronic device for obtaining logging information. The logging tool 26 may include one or more sensors 30 coupled to one or more electronic components 32 enclosed by a housing 34. The logging tool 26 may include one or more windows 36 to allow detection (e.g., X-ray detection, gamma-ray detection) or sensing in some embodiments. The logging tool 26 may be deployed inside the wellbore 16 by the surface equipment 12, which may include a vehicle 38 and a deploying system such as a drilling rig 40. Data related to the geological formation 14 or the wellbore 16 gathered by the logging tool 26 may be transmitted to the surface, and/or stored in the logging tool 26 for later processing and analysis. The vehicle 38 may be equipped with or may communicate with a computer and software to perform data collection and analysis.

FIG. 1 also schematically illustrates a magnified view of a portion of the cased wellbore 16. As mentioned above, the logging tool 26 may obtain data and/or measurements relating and provide such data and/or measurements to the surface equipment 12 (e.g., through the cable 28), the surface equipment 12 may pass the data and/or measurements to a data processing system 46 that includes a processor 48, memory 50, storage 52, and/or a display 54. In other examples, the data and/or measurements may be processed by a similar data processing system 46 at any other suitable location. The memory 50 and/or the storage 52 of the data processing system 46 may be any suitable article of manufacture that can store the instructions. The memory 50 and/or the storage 52 may be ROM memory, random-access memory (RAM), flash memory, an optical storage medium, or a hard disk drive, to name a few examples. The display 54 may be any suitable electronic display that can display the logs and/or other information relating to classifying the material in the annulus 20 behind the casing 22.

It may be appreciated that the logging operation relies at least in part on operation of electronic devices that are subjected to harsh operation conditions. As such, the logging operation may benefit from electronic devices having integrated boron nitride nanotubes (BNNTs) for enhanced performance and reliability, wherein the BNNTs have a unique combination of properties, such as high thermal conductivity, low electrical conductivity, and high mechanical strength, among other properties. It is should also be noted that although a well logging operation is provided as an example in FIG. 1, the application of electronic devices comprising BNNTs may be electronic devices used in any application, not limited to logging operation.

BNNTs have been measured to have a thermal conductivity about 3000 watts per meter kelvin (W/mK), making BNNTs a desirable material for heat dissipation. For comparison, the thermal conductivity of copper is about 400 W/mK. Further, BNNTs may be produced into a material that has a "cotton-like" appearance, such that the BNNTs may provide a network of fibers with a high level of continuity and interconnectivity providing an un-interrupted path for heat to flow and mechanical stress to be propagated and spread around in all directions. In addition, BNNTs have a bandgap about 5.5 electron volt (eV), making BNNTs suitable for applications where electrical insulation is desirable.

BNNTs also have a high mechanical strength, making BNNTs suitable for applications where shock and/or vibration resistance is desirable. BNNTs may be made transparent, which may be advantageous for applications where transparency is desirable, such as in windows, windshields, and/or transparent casings (or housings) to allow better associability for quality control and/or inspection. BNNTs also have high transparency to X-rays and gamma-rays, making which desirable for nuclear measurements as to enable higher X-rays and/or gamma-rays transmission (e.g., improved measurement accuracy). Further, it should be understood that because of the combination of properties or characteristics set forth above, BNNTs are desirable for many applications where multiple property requirements may be demanded, as will be discussed below.

Figure 2:
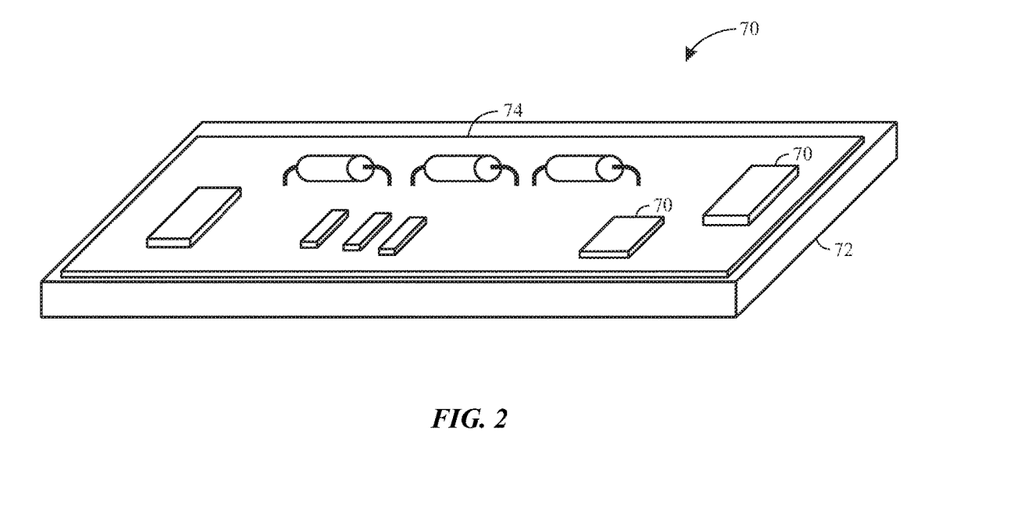
FIG. 2 is a schematic of a printed circuit board (PCB) having boron nitride nanotubes (BNNTs) integrated into a conformal coating for the PCB, in accordance with an embodiment.

FIG. 2 shows a schematic of electronic components 70 coupled to a printed circuit board (PCB) 72 having BNNTs integrated in a conformal coating 74. The PCB 72 may be used in any suitable electronic devices. In the illustrated embodiment, the electronic components 70 are coupled to the PCB 72, and the conformal coating 74 is disposed on the PCB 72. The conformal coating 74 may be used to protect the PCB 72 and/or the electronic components 70. The conformal coating 74 may include a polymer material applied to the PCB 72 to protect the PCB 72 and/or the electronic components 70 from interaction with contaminants, as well as to protect the PCB 72 and/or the electronic components 70 from shocks and vibrations. In addition, the conformal coating 74 may encase the electronic components 70 and keep the electronic components attached to the PCB 72 when subjected to high acceleration forces from shocks and vibrations.

BNNTs may be integrated with the polymer matrix of the conformal coating 74. For example, BNNTs may be integrated into a silicone based or polyimide based polymer matrix to make the conformal coating 74 of suitable thickness, such as between about 0.05 and about 0.1 millimeters (mm). The BNNT-integrated conformal coating 74 may have enhanced performance in terms of heat evacuation, electrical insulation, and enhanced mechanical strength. It may be appreciated that because of the superior thermal, electrical, and mechanical properties, little amount of BNNT incorporation (e.g., a low loading ratio) may be sufficient to achieve desirable thermal, electrical, and mechanical properties for the conformal coating 74, such that the BNNT-integrated conformal coating 74 may be thinner (e.g., as compared to a conformal coating 74 without BNNTs). In addition, because BNNTs may be made clear (e.g., substantially transparent), the BNNT-integrated conformal coating 74 may improve quality control. For example, because the BNNT-integrated conformal coating 74 may be made clear, it provide better accessibility to inspect the PCB 72 and/or the electronic components 70 (e.g., failure analysis and/or development).

It is worth mentioning that while boron nitride (BN) particles have been incorporated into conformal coatings, in these BN particle-incorporated conformal coatings, the loss of the transparency may sometimes overweigh the benefits of thermal management via the coatings. In comparison to BN particles, with low loading ratio of BNNTs, one may expect to have both transparency and thermal management. Further, it is also worth noting that BN powders may have a mean particle size in the range of about 10-50 microns, which is approaching the thickness of a conformal coating and may be a concern in applications where reduced size and/or dimension are desirable. For comparison, BNNTs may have a diameter on the order of a few nanometers, which is much thinner than the thickness of a conventional conformal coating, and with the low loading ratio, a BNNT-integrated conformal coating may be made thinner than a BN particle-integrated conformal coating.

The quantity of BNNTs incorporation into the conformal coating 70 may be any suitable quantity as to improve the heat dissipation while meeting requirements of a conformal coating, such as mechanical strength requirement, transparency requirement, thermal stability requirement, electrical insulation requirement, among other requirements. In some embodiments, the conformal coating 70 may include about 0.5% to about 5.0% BNNTs by weight.

Figure 3:
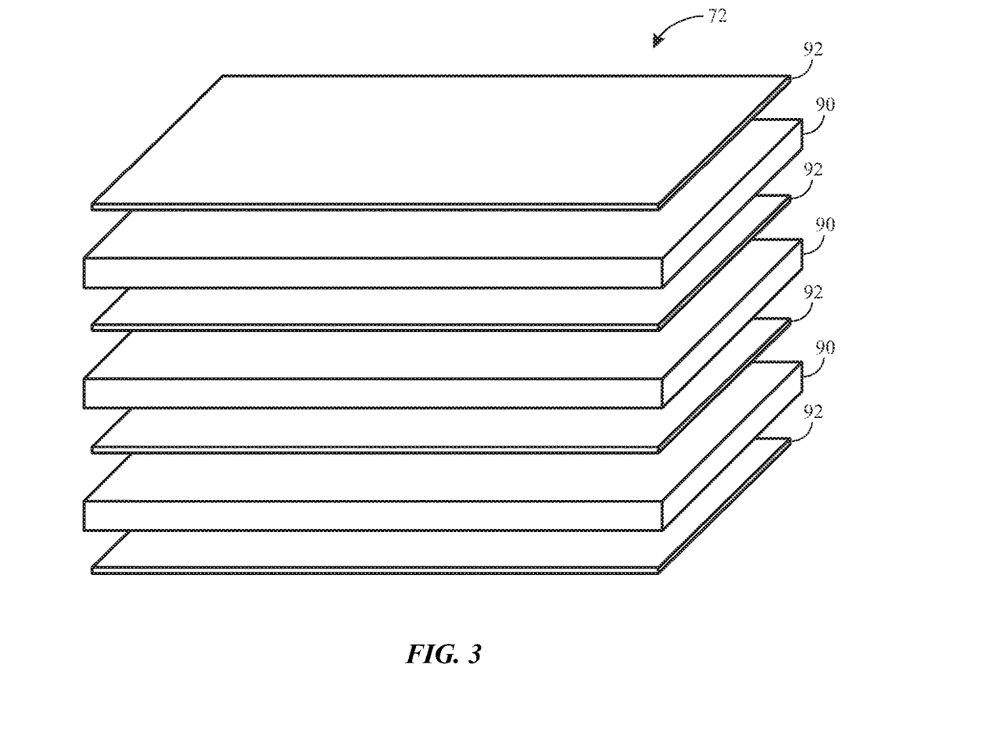
FIG. 3 is a schematic of a PCB having alternating electrically conductive and insulating layers, in accordance with an embodiment.
Figure 4:
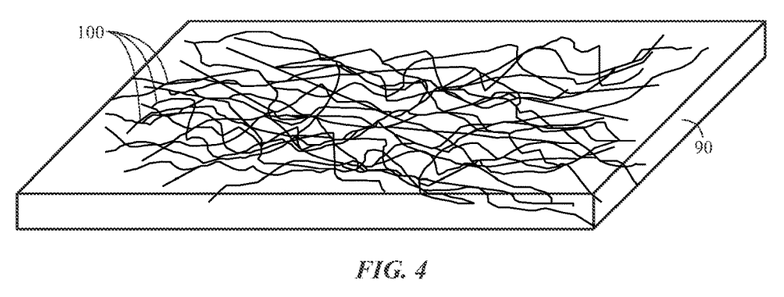
FIG. 4 is a schematic of an electrically insulating layer of a PCB that includes BNNTs, in accordance with an embodiment.
Figure 5:
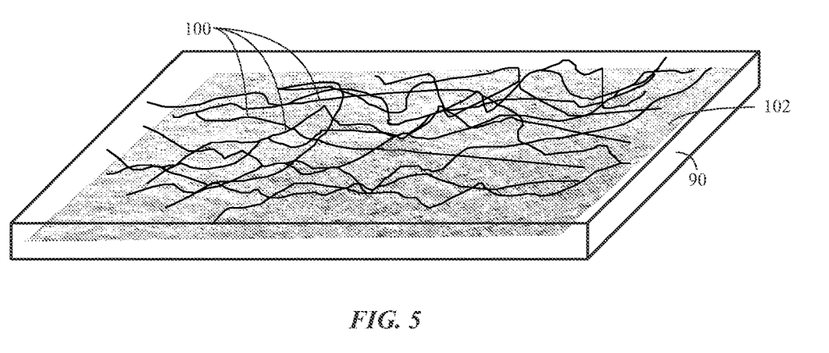
FIG. 5 is a schematic of an electrically insulating layer of a PCB that includes BNNTs integrated with a fiberglass matting, in accordance with an embodiment.

The application of BNNTs is not limited to integration into the conformal coating 74, and, additionally or alternatively, BNNTs may be incorporated into the PCB 72. As shown in FIG. 3, the PCB 72 may include one or more insulating layers 90 and one or more conducting layers 92 arranged in alternation. The one or more insulating layers 90 and the one or more conducting layers may be arranged in any other suitable fashions in other embodiments. The insulating layers 90 may include a polymer matrix (e.g., polyimide resin), reinforcement fibers (e.g., fiberglass), glass-reinforced epoxy laminate (e.g., FR-4 woven glass), any other suitable polymer matrix, or a combination thereof. In some embodiments, as shown in FIG. 4, BNNTs 100 may be integrated or incorporated into one or more of the insulating layers 90. The quantity of BNNTs incorporation into the insulating layers 90 may be any suitable quantity as to improve the heat dissipation and/or to improve the shock/vibration resistance while meeting requirements of a conformal coating, such as mechanical strength requirement, transparency requirement, thermal stability requirement, electrical insulation requirement, among other requirements. In some embodiments, the insulating layers 90 may each include about 0.5% to about 5.0% BNNTs by weight. In some embodiments, the quantity of the BNNTs may vary in different layers of the insulating layers 90. For example, the amount of BNNTs may be greater in an insulating layer that is closer to heated component(s) (e.g., electronic components 70) and may be less in an insulating layer that is farther away from heated component(s). In some embodiments, as shown in FIG. 5, the BNNTs 100 may be incorporated or integrated into the insulating layer 90 in combination with a fiberglass matting 102.

Since BNNTs 100 are mechanically strong, electrically insulating and heat dissipative, the incorporation of BNNTs 100 may reduce the thickness of the one or more insulating layers 90 of the PCB 72 (e.g., without compromising mechanical strength, electrical insulation or heat dissipation). It should also be noted that BNNT-incorporated PCBs may be advantageous in applications where heat removal is desirable, such as in electronic assemblies for automotive industry, aeronautic industry, oil and gas industry, etc. BNNT-incorporated PCBs may also be advantageous in applications where miniaturization of circuits is desirable and/or heat removal is desirable, such as in consumer electronics (e.g., cellular phones, personal electronic devices, and portable electronics).

Figure 6:
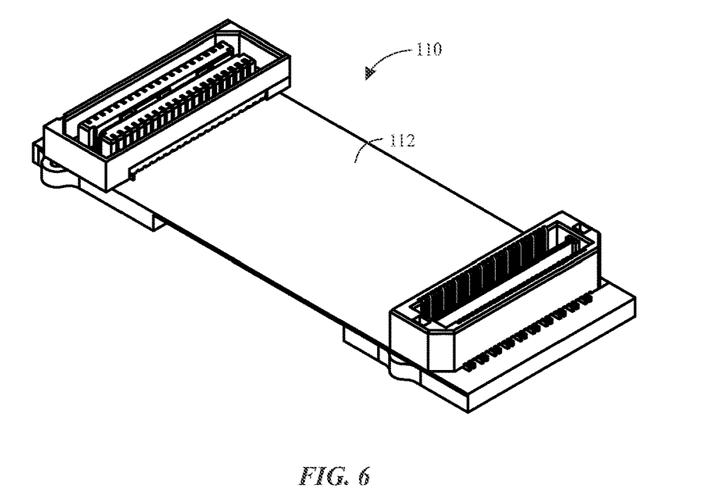
FIG. 6 is a schematic of a flexible interconnect circuit that includes BNNTs for enhanced performance, in accordance with an embodiment.

In some embodiments, as shown in FIG. 6, the BNNTs 100 may be incorporated in a flexible interconnect 110 or circuit board. The flexible interconnect 110 may include a flexible substrate 112, which may include polyimide, polyether ether ketone (PEEK), transparent conductive polyester, or any other suitable flexible material. The BNNTs 100 may be integrated or incorporated into the flexible substrate 112. Reinforcing the flexible substrate 112 with the BNNTs 100 may provide improved mechanical strength and improved heat dissipation while maintaining flexibility. In addition, the thermal stability of the BNNTs 100 also make which a desirable material to be integrated into the flexible substrate 112. In particular, the mechanical properties of the BNNTs may sustain elevated temperatures (e.g., the mechanical properties do not deteriorate significantly with increasing temperature), such that the BNNT-integrated flexible substrate 112 may maintain the flexibility even at elevated temperatures.

It may be appreciated that the quantity of BNNTs incorporation into the flexible substrate 112 may be any suitable quantity as to improve the heat dissipation and/or to improve mechanical strength and/or flexibility while meeting requirements of a flexible substrate, such as mechanical strength requirement, thermal stability requirement, electrical insulation requirement, among other requirements. In some embodiments, the flexible substrate 112 may include about 0.5% to about 5.0 BNNTs by weight.

Figure 7:
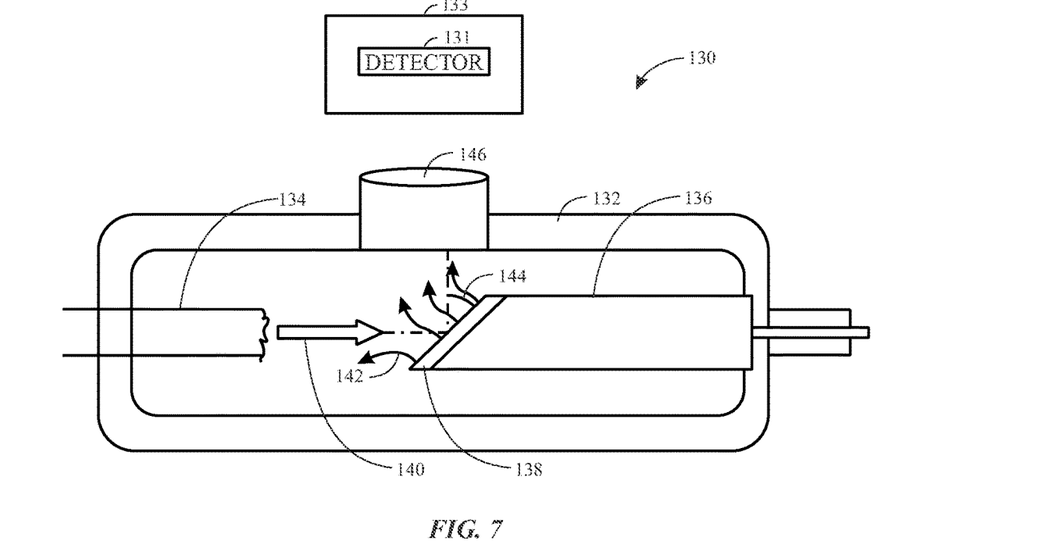
FIG. 7 is a schematic of a sensor that includes BNNTs for enhanced performance, in accordance with an embodiment.

In some embodiments, the BNNTs may be incorporated in nuclear radiation sensors, where high mechanical strength, high thermal stability, and high transparency to low energy X-rays, among other properties, are desirable. Measurements of formation photoelectric effect performed by nuclear density tools may rely on measuring photons with energy below 100 kiloelectron volt (keV). FIG. 7 shows a schematic of a side view of an X-ray tube 130 (e.g., X-ray source) as may be used with a scintillation detector 131. The X-ray tube 130 has a housing 132, and enclosed within the housing 132, the X-ray tube 130 includes a filament or cathode 134, an anode 136, and a target 138 coupled to the anode 136. Electrons are produced (e.g., via thermionic effect) as the filament 134 is heated by an electric current, and when a voltage potential is applied between the filament 134 and the anode 136, the electrons are thus accelerated toward the anode 136 as illustrated by an arrow of electron beam 140. The electron beam 140 hits the target 138 and X-ray photons 142 are produced. The anode 136 and the target 138 coupled thereto are at an angle 144 off perpendicular to the electron beam 140 as to allow the escape of some of the X-ray photons. In particular, the X-ray tube 130 has a window 146 configured for escape of the generated X-ray photons 142.

When a scintillation detector is used for nuclear density measurements, it may include one or more mechanical barriers between the photon source (e.g., the X-ray tube 130) and a sensing scintillating crystal. The one or more barriers may include the housing 132 of the X-ray tube 130, the window 146 of the X-ray tube 130, a housing 133 of the scintillation detector 131, and or any mechanical barrier between the scintillation detector and the X-ray source (e.g., X-ray tube 130). In one aspect, BNNTs may be used to cause the one or more mechanical barriers to be thermally stable and mechanically strong (e.g., to protect the sensing and measurement devices). In another aspect, it is desirable for the one or more mechanical barriers to be thin and/or transparent to X-rays (e.g., causing a relatively low attenuation of the X-rays). As such, the BNNTs 100 may be integrated into the one or more barriers to the extent that the BNNT-integrated one or more barriers may have a reduced X-ray attenuation for at least two reasons. First, the density of BNNTs is lower than the densities of other commonly used barrier materials, such as glass, PEEK, and Torlon. Second, even while achieving similar mechanical strength, the BNNT-integrated barriers may be made thinner and therefore more transparent to X-rays.

It should be noted that the X-ray tube 130 and scintillator are discussed as non-limiting examples, and BNNTs 100 may be integrated into housing (e.g., casing, enclosure) and/or windows for other devices where high mechanical strength and/or low attenuation of X-ray, gamma-ray and/or other radiation are desirable. For example, BNNTs may also be integrated into photodetector housings of charge-coupled device (CCD) sensors, avalanche photodiode (APD) sensors, complementary metal-oxide semiconductor (CMOS) panels, X-ray cameras, etc. The quantity of BNNTs incorporation into the mechanical barrier (e.g. housing, casing, enclosure, window) may be any suitable quantity as to improve mechanical strength and/or reduce radiation attenuation, among other requirements. In some embodiments, the mechanical barrier may include about 0.5% to about 5.0 BNNTs by weight.

Figure 8:
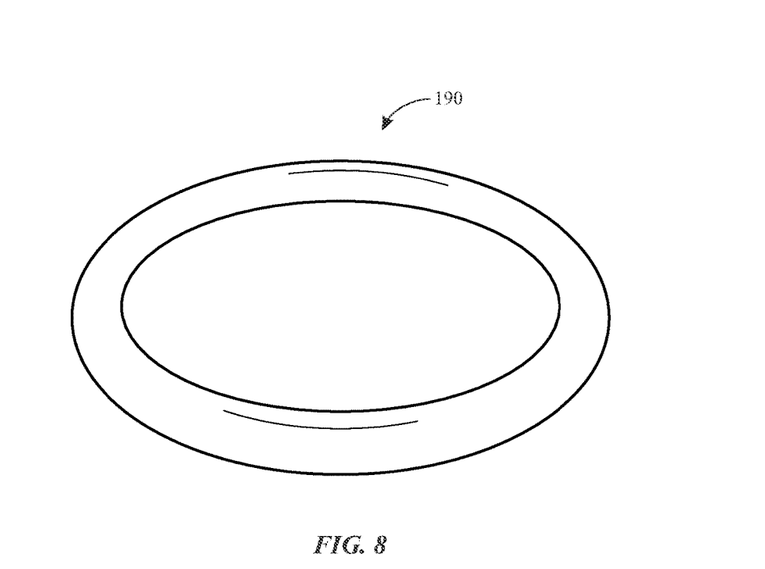
FIG. 8 is a schematic of a sealing component that includes BNNTs for enhanced performance, in accordance with an embodiment.

In some embodiments, as shown in FIG. 8, the BNNTs 100 may be incorporated in a sealing or packing component 190, such as an O-ring, a toric joint, or a gasket. The sealing or packing component 190 may include elastomers, polyamide, polyvinyl chloride, silicon, or other suitable polymer materials to withstand exerted mechanical forces and to prevent moisture penetration. In some embodiments, the BNNTs 100 may be incorporated into the polymeric matrix of the sealing or packing component 190. In some embodiments, the BNNTs 100 may be applied as a coating onto the sealing or packing component 190. Reinforcing the sealing or packing component with the BNNTs 100 may provide improved moisture resistance, improved mechanical strength (e.g., wear resistance), and improved heat dissipation while maintaining flexibility. The improved moisture resistance may be attributed to the hydrophobic properties of the BNNTs 100 that may depend on the orientation and packing density of the BNNTs 100. In some embodiments, the sealing or packing component 190 may include about 0.5% to about 5.0% BNNTs by weight.

In some embodiments, the BNNTs 100 may be incorporated in a filler for polydimethylsiloaxene silicone stamps used in manufacturing of plastic plates with high resolution (e.g., flexography). The incorporation of BNNTs 100 may reduce the stamp deformation and thereby improve the absolute distortions. The thickness of the polydimethylsiloaxene silicone layer may be about 50 microns. The BNNTs 100 may be incorporated in the polydimethylsiloaxene silicone layer, and the BNNTs 100 may have a substantially uniform distribution in the polydimethylsiloaxene silicone layer. In some embodiments, the filler may include about 0.5% to about 5.0% BNNTs by weight.

In some embodiments, as shown in FIGS. 9 to 12, the BNNTs 100 may be incorporated in one or more polymeric components of a cable. Indeed, any suitable cables may include the BNNTs 100, including those described in U.S. Patent Application Publication No. 2015/0170791, titled "Torque-Balanced Electrical Cable" and filed on Feb. 23, 2015, which is hereby incorporated by reference herein its entirety for all purposes.

Figure 9A:
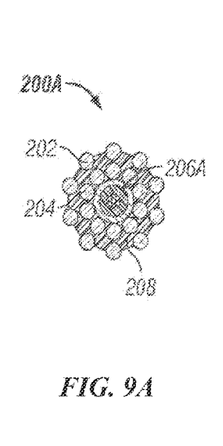
FIGS. 9A through 9D are radial cross-section views of an embodiment of a cable that includes BNNTs for enhanced performance, in accordance with an embodiment.
Figure 9B:
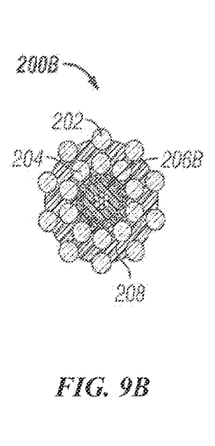
Figure 9C:
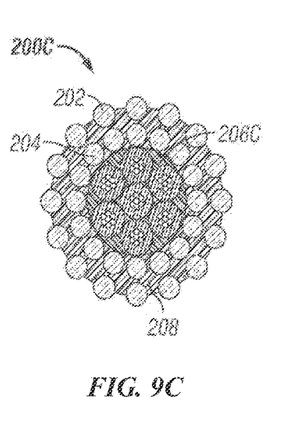
Figure 9D:
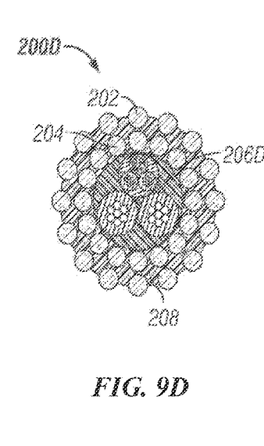
Figure 10A:
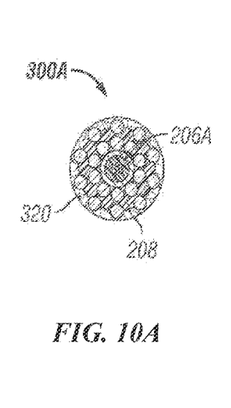
FIGS. 10A through 10D are radial cross-section views of an embodiment of a cable that includes BNNTs for enhanced performance, in accordance with an embodiment.
Figure 10B:
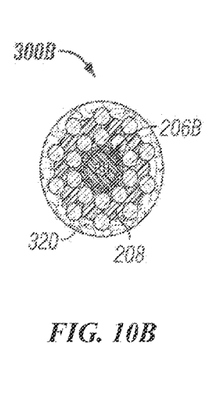
Figure 10C:
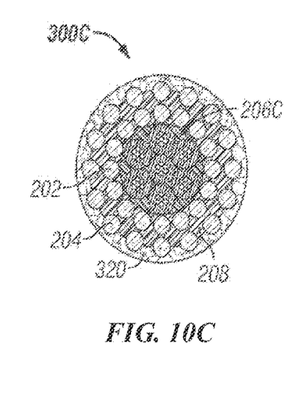
Figure 10D:
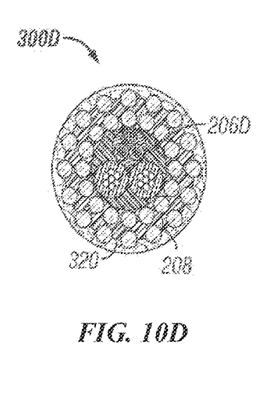
Figure 11A:
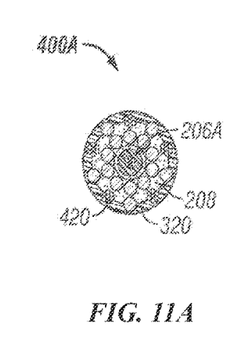
FIGS. 11A through 11D are radial cross-section views of an embodiment of a cable that includes BNNTs for enhanced performance, in accordance with an embodiment.
Figure 11B:
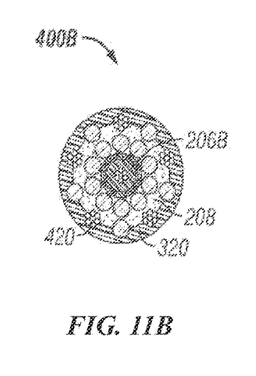
Figure 11C:
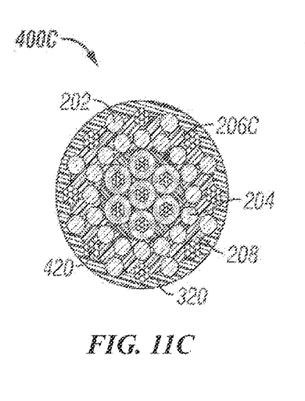
Figure 11D:
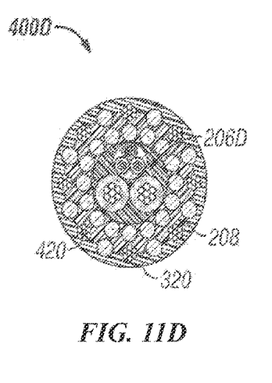

Referring now to FIGS. 9A through 9D, an embodiment of a cable is indicated generally at 200. FIGS. 9A-9D show a cable 200A, 200B, 200C, and 200D, respectively. The cables 200A, 200B, 200C and 200D comprise damage-resistant outer armor wires 202, which may advantageously be applied to any basic wireline cable configuration or core. In non-limiting examples, FIG. 9A shows a monocable cable core with stranded wires 206A, FIG. 9B shows a coaxial cable core 206B, FIG. 9C shows a heptacable cable core 206C, and FIG. 9D shows a triad cable core 206D having multiple cable conductors as part of the core 206D. The conductors forming the cable cores 206A, 206B, 206C, and 206D may be any combination of (but not limited to) monocables, coaxial cables, copper conductors, optical fibers (such as those shown in FIG. 9D) or the like and be insulated with any suitable polymeric material or materials as will be appreciated by those skilled in the art. As shown in FIGS. 9A-9D, the inner armor layer 204 carries more load since its pitch diameter is smaller than outer armor layer 202.

The outer armor wires 202 shown in FIGS. 9A-9D are sized similarly to the inner armor wires 204 but the layer of the outer armor wires 202 covers a predetermined percentage of the circumference of the inner armor wires 204 in order to prevent torque imbalance in the cable 200. The predetermined percentage of coverage may be, but not limited to, about 50% to about 90% coverage of the circumference of the inner armor wire layer 204, which is smaller than the percentage coverage of the armor wire layers 12 and 14 shown in the prior art cable 10 in FIG. 1 of U.S. Patent Application Publication No. 2015/0170791. The predetermined percentage of coverage may be, but not limited to, about 50% to about 90% coverage of the circumference of the cable cores 206A, 206B, 206C, and 206D, which is smaller than the percentage coverage of the armor wire layers 12 and 14 and cable core 16 shown in the prior art cable 10 in FIG. 1 of U.S. Patent Application Publication No. 2015/0170791. This smaller percentage of coverage of the outer armor wires 202 with respect to the inner armor wires 204 advantageously maintains the torque-balance of the cable 200A-200D and increases the ability of the outer armor wires 202 to withstand abrasion damage. In a non-limiting example, the number of armor wires in the inner armor layer 204 and the number of armor wires in the outer armor layer 202 are equal, providing a predetermined coverage in direct relation to the respective diameters of the individual armor wires 202 and 204 and radial spacing of the armor wire layers 202 and 204. The predetermined coverage may be selected by a number of factors which may include, but are not limited to, the size and/or diameter of the cable 200A-200D, the size and/or diameter of the cable core 206A-206D, the size and/or diameter of the individual members of the armor wire layers 202 and 204, and the radial spacing between the armor wire layers 202 and 204. The inner armor wires 204 may cover a predetermined percentage of the circumference of the cable core 206A-206D that may be, but is not limited to, about 98% to about 99% of the circumference of the cable core 206A-206D.

A polymeric insulating material 208 may be disposed on the inner armor wire layer 204, the cable core 206A, 206B, 206C, and 206D and a portion of the outer armor wire layer 202 and may bond the armor wire layers 202 and 204 to the cable core 206 A-D, including the insulating layer of the cable core 206 A-D. The insulating material 208 may be formed from any suitable material such as, but not limited to, the following: polyolefin or olefin-base elastomer (such as Engage®, Infuse®, etc.); thermoplastic vulcanizates (TPVs) such as Santoprene® and Super TPVs and fluoro TPV (F-TPV); silicone rubber; acrylate rubber; soft engineering plastics (such as soft modified polypropylene sulfide (PPS] or modified Poly-ether-ether-ketone [PEEK]); soft fluoropolymer (such as high-melt flow ETFE (ethylene-tetrafluoroethylene) fluoropolymer; fluoroelastomer (such as DAI-EL™ manufactured by Daikin); and thermoplastic fluoropolymers. The radial thickness of the insulating material 208 and thus the radial spacing between the armor wire layers 202 and 204 may be varied to achieve torque balancing of the cables 200A-200D and/or prevent torque imbalance of the cables 200A-200D, as will be appreciated by those skilled in the art.

FIGS. 10A-10D show the cables of FIGS. 9A-9D having an outer jacket 320 bonded to the insulating material 208 to form a jacketed cable 300A, 300B, 300C, and 300D that correspond, respectively, to cables 200A, 200B, 200C, and 200D. Referring now to FIG. 10, there are shown embodiments of torque-balanced cables 300A, 300B, 300C, and 300D that comprise the cables shown in FIGS. 9A-9D having with damage-resistant outer armor wires with a bonded outer jacket 320. By providing the bonded outer polymeric jacket 320 over the embodiments shown in FIG. 9, the cable is preferably more easily sealed at the well surface. The outer jacket 320 may comprise any suitable material such as, for example, carbon-fiber-reinforced Tefzel®, carbon-fiber-reinforced ETFE (ethylene-tetrafluoroethylene) fluoropolymer or similar suitable material that is applied over the outer armor wire layer, bonding through the gaps in the outer strength members 204, which creates a totally bonded jacketing cable system 300A-300D. The addition of the fiber-reinforced polymer 320 also provides a more durable outer surface. The outer jacket 320 may be bonded to the insulating material 208 and/or to the outer armor wires 202.

FIGS. 11A-11D show the of cables of FIGS. 10A-10D comprising optional stranded wire outer armor wire layers 420 to form cable embodiments, indicated generally at 400A, 400B, 400C, and 400D. As an option to the embodiments shown in FIGS. 9A-9D and 10A-10D described above, any solid armor wire 202 or 302 in the outer layer may be replaced with similarly size stranded armor wires 420. The replacement of solid armor wire 202 with stranded armor wires 420 makes the cable 400A, 400B, 400C, and 400D more flexible. In addition, the stranded armor wires 420 have more friction and bonding with the jacket 320 and the jacket 320 over the stranded wires 420 also protects the small individual elements from abrasion and cutting.

Embodiments of the cables 200A, 200B, 200C, 200D, 300A, 300B, 300C, 300D, 400A, 400B, 400C, and 400D have a lower coverage, from about 50% to about 90%, in the outer armor layer 202. The cables maintain the size and durability of outer strength members 202 while creating torque balance between inner armor layers 204 and the outer armor layers 202. The weight of the cables is reduced because of the lower coverage percentage. The cable is preferably a seasoned cable and requires no pre-stress and also has less stretch. Because all interstitial spaces between the armor wires 202 and 204 are filled by polymers 208 and 320, the cables need less grease for the seal (not shown) at the well surface (not shown). Embodiments of the cables may comprise an outer layer of polymer 320 to create a better seal.

Embodiments of the cables 200A, 200B, 200C, 200D, 300A, 300B, 300C, 300D, 400A, 400B, 400C, and 400D minimize the problems described above by filling interstitial spaces among armor wires and the cable core with polymers 208 and 320, by using large diameter armor wires but a low coverage (50% to 90%) for the outer armor layer to reach torque balance, and by using a triad configuration, discussed in more detail below.

The polymeric layers 208 and/or 320 provide several benefits including, but not limited to, filling space into which the inner armor wire might otherwise be compressed thereby minimizing cable stretch, keeping cable diameter while cable at tension, reducing torque since the reduction in pitch diameter is minimized, eliminating the space in the cable along which pressurized gas might travel to escape the well, protecting the cable core from damage caused by inner armor wires, cushioning contact points among armor wires to minimize damage caused by armor wires rubbing against each other, sitting low coverage outer armor wires to avoid loose wires, and produces seasoned alloy cables.

The low coverage (about 50% to about 90%) of armor wire in the outer layer 202 or 420 provides several benefits including, but not limited to, maintaining torque balance, maintaining the size and durability of outer armor wires 202 or 420, and lowering the weight of the cable by reducing the coverage of the armor wire 202 or 420.

Figure 12A:
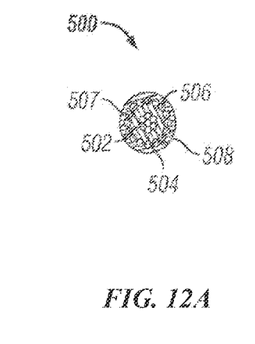
FIGS. 12A through 12D are radial cross-section views of an embodiment of a cable that includes BNNTs for enhanced performance, in accordance with an embodiment.

Referring now to FIGS. 12A-12D, there is shown an embodiment of a torque-balanced triad cable configuration 520 in which the armor wire may be any kind of strength member. The cable may be constructed as follows:

As shown in FIG. 12A, individual conductors 500 may be constructed with a copper, optical fiber or other conductor or conductors 502 at the center contained in a hard polymeric insulation 504. Armor wires 506 may be cabled helically in a direction indicated by an arrow 507 over the polymer 504 and a second layer of softer polymer 508 is extruded over the armor wires 506.

Figure 12B:
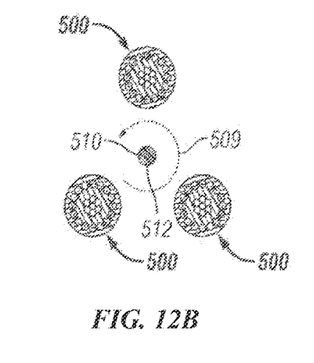

As shown in FIG. 12B, preferably three conductors 500, as shown in FIG. 12A, are cabled together at a lay angle, indicated by an arrow 509, opposite to that of the lay angle 507 of the armor wires 506 in the individual conductors 500. Alternatively, a central member 510 with soft polymer insulation 512 is placed at the center of the three conductors 500.

Figure 12C:
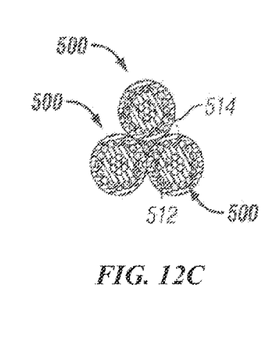

As shown in FIG. 12C, when the three conductors 500 are cabled together, the soft polymer 512 on the central element deforms to fill the interstitial space between the three conductors 500. The diameter of a circle passing through the centers of each of the three conductors 500 (indicated by an arrow 514) is preferably approximately the same size as the individual diameter of each of the three conductors 500, which allows the cable to achieve torque balance by slight adjustments in the opposing lay angles of the armor wires 506 and the completed cable 500.

Figure 12D:
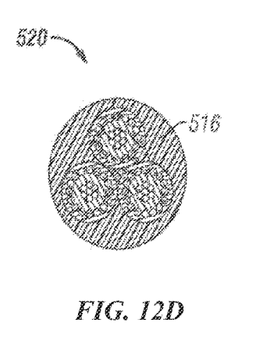

As shown in FIG. 12D, a final hard polymeric jacket 516, which may be pure polymer or short-fiber-amended polymer or another suitable material, is extruded over the cabled conductors 500 to complete the cable 520.

The cable 520 comprises a low weight torque balanced cable in a triad cable configuration. This embodiment comprises only one layer of armor 506 in each conductor 500 of the triad cable. The lay direction of the armor wire 506 is preferably opposite to the lay direction of the triad 509 to reach torque balance. The triad configuration of the cable 520 provides several benefits including, but not limited to, keeping torque balance of the cable 520, minimizing the contact points of armor wires to minimize damage caused by armor wires 506 rubbing against each other, and lowering the weight of the cable 520 by using only one layer of armor wire 506 in each conductor 500.

The specific embodiments described above have been shown by way of example, and it should be understood that these embodiments may be susceptible to various modifications and alternative forms. It should be further understood that the claims are not intended to be limited to the particular forms disclosed, but rather to cover modifications, equivalents, and alternatives falling within the spirit and scope of this disclosure.

The invention claimed is:

1. A downhole tool comprising:
a housing; and
a measurement device disposed in the housing, wherein the measurement device comprises a sensor and electronic circuitry configured to detect or process signals detected by the sensor;
wherein the housing, the sensor, or the electronic circuitry, or any combination thereof, comprise a polymer matrix with integrated boron nitride nanotubes having a first concentration and a second concentration;
wherein the first concentration of integrated boron nitride nanotubes is configured to satisfy a first transparency specification of x-rays, gamma-rays, visible light, or a combination thereof and wherein the first concentration is different from the second concentration.

2. The downhole tool of claim 1, wherein the housing comprises a window portion disposed adjacent to the sensor that includes integrated boron nitride nanotubes.

3. The downhole tool of claim 2, wherein the window portion comprises glass with the integrated boron nitride nanotubes, wherein the window portion is substantially transparent to X-rays or gamma-rays.

4. The downhole tool of claim 2, wherein the measurement device comprises a radiation source configured to emit radiation through the window portion of the housing.

5. The downhole tool of claim 1, wherein the sensor comprises a scintillation detector that comprises a window portion that includes integrated boron nitride nanotubes.

6. The downhole tool of claim 1, wherein the electronic circuitry comprises a printed circuit board, wherein the printed circuit board comprises an insulating layer and a conductive layer coupled to the insulating layer, wherein the insulating layer comprises a polymer matrix with integrated boron nitride nanotubes.

7. The downhole tool of claim 1, wherein the electronic circuitry comprises a printed circuit board, wherein a conformal coating is disposed over the circuit board, wherein the conformal coating comprises a polymer matrix with integrated boron nitride nanotubes.

8. A downhole well-logging tool configured to be placed in a downhole environment, comprising:
a housing; and
a circuit board disposed in the housing, wherein the circuit board comprises:
an insulating material; and
a first conductive layer disposed on or within the insulating material;

wherein a first portion of the circuit board comprises a first concentration of boron nitride nanotubes configured to meet a first transparency specification for electromagnetic waves;

wherein a second portion of the circuit board comprises a second concentration of boron nitride nanotubes not configured to meet the first transparency specification; and wherein the first concentration is different from the second concentration.

9. The downhole well-logging tool of claim 8, wherein the circuit board comprises a printed circuit board, wherein the insulating material forms an insulating layer between the first conductive layer and a second conductive layer.

10. The downhole well-logging tool of claim 8, wherein the circuit board comprises a flexible interconnect comprising the insulating material.

11. The downhole well-logging tool of claim 8, comprising a conformal coating disposed over the circuit board, wherein the conformal coating includes integrated boron nitride nanotubes.

12. The downhole well-logging tool of claim 8, wherein the first concentration of boron nitride nanotubes are disposed in a polymer matrix, wherein the first concentration of boron nitride nanotubes make up about 0.5% to about 5.0% by weight with respect to matrix.

13. The downhole well-logging tool of claim 8, wherein the electronic device comprises a scintillator detector.

14. The downhole well-logging tool of claim 8, wherein the electronic device comprises a charge-coupled device sensor, an avalanche photodiode sensor, or a complementary metal-oxide semiconductor panel.

15. A method of manufacturing a downhole tool, comprising:

coupling an insulating layer to a conducting layer to form a circuit board of the downhole tool; and enclosing, within a housing, the circuit board and electronic components coupled thereto, wherein the insulating layer or the housing comprises a matrix with a first concentration of integrated boron nitride nanotubes configured to satisfy a mechanical strength specification for the downhole tool, a first transparency specification for radiation waves, or a combination thereof, and a second concentration of integrated boron nitride nanotubes wherein the first concentration is different from the second concentration.

16. The method of claim 15, wherein the housing comprises a conformal coating on the circuit board, wherein the conformal coating comprises a polymer matrix integrated with the first concentration of boron nitride nanotubes.

17. The method of claim 15, wherein the first concentration of integrated boron nitride nanotubes are about 0.5% to about 5.0% by weight with respect to the matrix.

18. The downhole tool of claim 1, wherein the polymer matrix with integrated boron nitride nanotubes is configured to provide sufficient mechanical strength to the downhole tool for use in well logging.

19. The downhole well-logging tool of claim 8, wherein the first transparency specification comprises a transparency requirement of x-rays, gamma-rays, visible light, or a combination thereof.

* * * * *